United States Patent
Tsai et al.

(10) Patent No.: US 9,543,257 B2
(45) Date of Patent: Jan. 10, 2017

(54) 3DIC INTERCONNECT DEVICES AND METHODS OF FORMING SAME

(71) Applicant: Taiwan Semiconductor Manufacturing Company, Ltd., Hsin-Chu (TW)

(72) Inventors: Shu-Ting Tsai, Kaohsiung (TW); Jeng-Shyan Lin, Tainan (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/491,757

(22) Filed: Sep. 19, 2014

(65) Prior Publication Data

US 2015/0348917 A1    Dec. 3, 2015

Related U.S. Application Data

(63) Continuation-in-part of application No. 14/467,981, filed on Aug. 25, 2014, now abandoned.

(60) Provisional application No. 62/004,794, filed on May 29, 2014.

(51) Int. Cl.
| | |
|---|---|
| *H01L 23/48* | (2006.01) |
| *H01L 25/065* | (2006.01) |
| *H01L 21/768* | (2006.01) |
| *H01L 23/58* | (2006.01) |

(52) U.S. Cl.
CPC ....... *H01L 23/585* (2013.01); *H01L 21/76898* (2013.01); *H01L 23/481* (2013.01); *H01L 25/0657* (2013.01); *H01L 21/76805* (2013.01); *H01L 2224/45144* (2013.01); *H01L 2224/48463* (2013.01)

(58) Field of Classification Search
CPC ............... H01L 23/481; H01L 25/0657; H01L 21/76898
USPC ........................................................ 257/762
See application file for complete search history.

(56) References Cited

U.S. PATENT DOCUMENTS

| | | |
|---|---|---|
| 4,956,312 A | 9/1990 | Van Laarhoven |
| 6,111,319 A | 8/2000 | Liou et al. |
| 6,207,494 B1 | 3/2001 | Graimann et al. |
| 7,453,150 B1 | 11/2008 | McDonald |
| 7,535,920 B2 | 5/2009 | Robertson |

(Continued)

FOREIGN PATENT DOCUMENTS

| | | |
|---|---|---|
| JP | 2010114165 A | 5/2010 |
| JP | 2013251511 A | 12/2013 |
| KR | 20100094905 A | 8/2010 |

OTHER PUBLICATIONS

Quirk, Michael et al., "Semiconductor Manufacturing Process," 2001, Prentice-Hall, Inc, Chapter 12, p. 300.

*Primary Examiner* — Jarrett Stark
*Assistant Examiner* — Charles N Ausar-El
(74) *Attorney, Agent, or Firm* — Slater Matsil, LLP

(57) ABSTRACT

An interconnect device and a method of forming the interconnect device are provided. Two integrated circuits are bonded together. A first opening is formed through one of the substrates. One or more dielectric films are formed along sidewalls of the first opening. A second opening is formed extending from the first opening to pads in the integrated circuits, while using some of the pads as hard masks. The first opening and the second opening are filled with a conductive material to form a conductive plug.

21 Claims, 16 Drawing Sheets

(56) References Cited

U.S. PATENT DOCUMENTS

| | | | |
|---|---|---|---|
| 7,642,173 B2* | 1/2010 | McDonald | H01L 21/76898 438/455 |
| 8,125,052 B2* | 2/2012 | Jeng | H01L 23/585 257/409 |
| 8,153,521 B2 | 4/2012 | Kang et al. | |
| 8,158,515 B2 | 4/2012 | Farooq et al. | |
| 8,344,514 B2* | 1/2013 | Cobbley | H01L 21/76898 257/773 |
| 8,358,008 B2 | 1/2013 | Wada et al. | |
| 8,421,193 B2* | 4/2013 | Huang | H01L 21/6835 257/621 |
| 8,525,345 B2* | 9/2013 | Yen | H01L 23/3114 257/773 |
| 8,592,991 B2* | 11/2013 | Lee | H01L 21/76898 257/774 |
| 8,692,382 B2* | 4/2014 | Yen | B81B 7/007 257/773 |
| 8,729,711 B2* | 5/2014 | Nishio | H01L 21/3221 257/773 |
| 9,006,804 B2* | 4/2015 | Hung | H01L 21/28008 257/288 |
| 9,059,696 B1 | 6/2015 | Rahman | |
| 2002/0123219 A1 | 9/2002 | Laverty et al. | |
| 2006/0073695 A1 | 4/2006 | Filippi et al. | |
| 2009/0014843 A1 | 1/2009 | Kawashita et al. | |
| 2009/0134432 A1 | 5/2009 | Tabata et al. | |
| 2009/0166840 A1 | 7/2009 | Kang et al. | |
| 2010/0090317 A1* | 4/2010 | Zimmermann | H01L 21/76898 257/621 |
| 2010/0171196 A1 | 7/2010 | Steadman et al. | |
| 2010/0224876 A1 | 9/2010 | Zhu | |
| 2010/0238331 A1 | 9/2010 | Umebayashi et al. | |
| 2011/0062501 A1 | 3/2011 | Soss et al. | |
| 2011/0133339 A1 | 6/2011 | Wang | |
| 2011/0171582 A1* | 7/2011 | Farooq | H01L 21/3085 430/314 |
| 2011/0171827 A1* | 7/2011 | Farooq | H01L 21/0337 438/653 |
| 2012/0038020 A1* | 2/2012 | Lin | H01L 21/6835 257/503 |
| 2012/0038028 A1* | 2/2012 | Yaung | H01L 23/585 257/620 |
| 2012/0056330 A1* | 3/2012 | Lee | H01L 21/76898 257/774 |
| 2012/0181698 A1* | 7/2012 | Xie | H01L 21/76898 257/770 |
| 2012/0193785 A1 | 8/2012 | Lin et al. | |
| 2013/0093098 A1* | 4/2013 | Yang | H01L 21/76898 257/774 |
| 2013/0140680 A1* | 6/2013 | Harada | H01L 21/76898 257/621 |
| 2013/0264688 A1* | 10/2013 | Qian | H01L 21/76898 257/622 |
| 2013/0292794 A1* | 11/2013 | Pai | H01L 23/5223 257/532 |
| 2014/0070426 A1* | 3/2014 | Park | H01L 23/53238 257/774 |
| 2014/0175653 A1* | 6/2014 | Sandhu | H01L 21/76816 257/754 |
| 2014/0247380 A1 | 9/2014 | Hynecek | |
| 2014/0264709 A1 | 9/2014 | Tsai et al. | |
| 2014/0264862 A1 | 9/2014 | Tsai et al. | |
| 2014/0264911 A1 | 9/2014 | Lin et al. | |
| 2014/0264947 A1 | 9/2014 | Lin et al. | |
| 2015/0129942 A1 | 5/2015 | Kao | |
| 2015/0137238 A1* | 5/2015 | Tsunemi | H01L 27/12 257/347 |
| 2015/0221695 A1* | 8/2015 | Park | H01L 27/14636 257/774 |
| 2015/0243582 A1* | 8/2015 | Klewer | H01L 23/481 257/368 |
| 2016/0086997 A1* | 3/2016 | Okamoto | H01L 21/76898 257/448 |

* cited by examiner

3DIC INTERCONNECT DEVICES AND METHODS OF FORMING SAME

PRIORITY CLAIM AND CROSS-REFERENCE

This application is a continuation-in-part of U.S. patent application Ser. No. 14/467,981, entitled "3DIC Interconnect Devices and Methods of Forming Same," filed on, Aug. 25, 2014, which claims the benefit of U.S. Provisional Application Ser. No. 62/004,794, filed on May 29, 2014, entitled "Through Oxide Vias and Methods of Forming Same," all of which are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be stacked on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
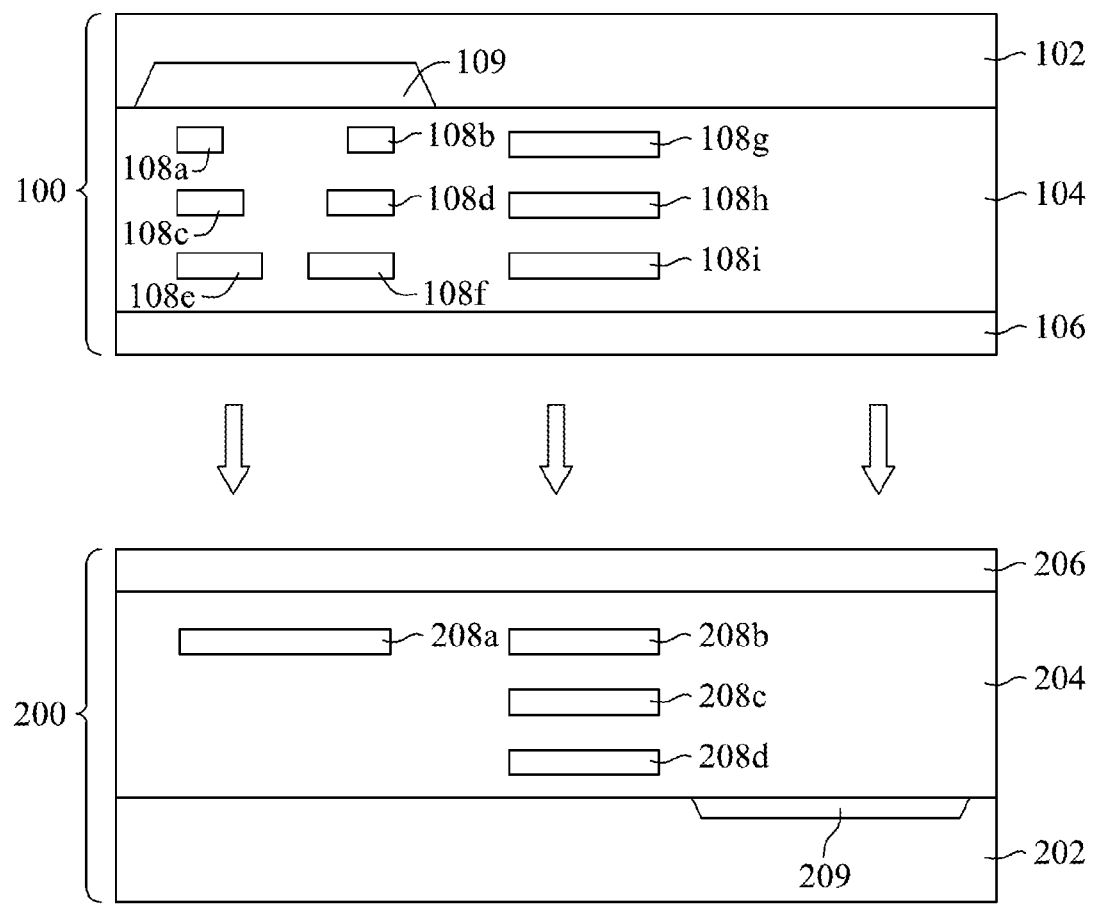
FIGS. 1A-1D are cross-sectional views of various processing steps during fabrication of an interconnect structure between two bonded workpieces in accordance with some embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely, a method for forming interconnect structures for a stacked semiconductor device. Other embodiments, however, may be applied to a variety of semiconductor devices. Hereinafter, various embodiments will be explained in detail with reference to the accompanying drawings.

FIGS. 1A-1D illustrate various intermediate steps of forming an interconnect structure between two bonded workpieces in accordance with a first embodiment. Referring first to FIG. 1A, a first workpiece 100 and a second workpiece 200 is shown prior to a bonding process in accordance with various embodiments. In an embodiment, the second workpiece 200 has similar features as the first workpiece 100, and for the purpose of the following discussion, the features of the second workpiece 200 having reference numerals of the form "2xx" are similar to features of the first workpiece 100 having reference numerals of the form "1xx." The various elements of the first workpiece 100 and the second workpiece 200 will be referred to as the "first <element>1xx" and the "second <element>2xx," respectively.

In an embodiment, the first workpiece 100 comprises a first substrate 102. The first substrate 102 may be formed of silicon, although it may also be formed of other group III, group IV, and/or group V elements, such as silicon, germanium, gallium, arsenic, and combinations thereof. The first substrate 102 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

The first substrate 102 may further comprise a variety of electrical circuits (not shown). The electrical circuits formed on the first substrate 102 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like.

The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

In some embodiments, the electrical circuits are electrically isolated using one or more first shallow trench isolation (STI) regions 109 as illustrated in FIG. 1A. In the illustrated embodiment, the first substrate 102 is patterned using, for example, photolithographic masking and etching process to form openings in the first substrate 102. Subsequently, the openings are filled with a dielectric material, and portions of the dielectric material overfilling the openings are removed using, for example, an etch process, chemical mechanical polishing (CMP), or the like. The one or more first STI regions 109 may be formed of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. In some embodiments, the one or more first STI regions 109 are formed through a process such as chemical vapor deposition (CVD), plasma-enhanced CVD (PECVD), or a spin-on process, although any acceptable process may be utilized.

Referring further to FIG. 1A, first inter-metal dielectric (IMD) layers 104 are formed over the first substrate 102. As shown in FIG. 1A, the first IMD layers 104 may comprise first conductive lines 108a-108i (collectively referred to as first conductive lines 108). The first IMD layers 104 and the first conductive lines 108 form first metallization layers over the first substrate 102. Generally, metallization layers are used to interconnect the electrical circuitry to each other and to provide an external electrical connection. As shown in FIG. 1A, the first workpiece 100 comprises nine conductive lines (such as the first conductive lines 108a-108i). In other embodiments, number of conductive lines may be less or more than nine, and may vary according to the design requirement of the first workpiece 100.

The first IMD layers 104 may be formed, for example, of a low-K dielectric material, such as phosphosilicate glass (PSG), borophosphosilicate glass (BPSG), fluorinated silicate glass (FSG), undoped silicate glass (USG), $SiO_xC_y$, SiOCH, Spin-On-Glass, Spin-On-Polymers, high-density plasma (HDP) oxide, tetraethyl orthosilicate (TEOS), plasma-enhanced TEOS (PETEOS), fluorine-doped silicon oxide, carbon-doped silicon oxide, porous silicon oxide, porous carbon-doped silicon oxide, black diamond, organic polymers, silicone based polymers, compounds thereof, composites thereof, combinations thereof, or the like, by any suitable method known in the art, such as spin-on, atomic layer deposition (ALD), chemical vapor deposition (CVD), plasma enhanced chemical vapor deposition (PECVD), the like, or a combination thereof.

The first conductive lines 108 may be formed through any suitable formation process (e.g., lithography with etching, damascene, dual damascene, or the like) and may be formed using suitable conductive materials such as copper, aluminum, aluminum alloys, copper alloys or the like. In some embodiments, each of the first conductive lines 108 may further comprise a diffusion barrier layer and/or an adhesion layer (not shown) to protect the first IMD layers from metal poisoning. The diffusion barrier layer may comprise one or more layers of TaN, Ta, TiN, Ti, CoW, or the like, and may be deposited by physical vapor deposition (PVD), or the like.

FIG. 1A further illustrates a first bonding layer 106 formed over the first IMD layers 104 of the first workpiece 100. As described below the first bonding layer 106 is subsequently used to bond the first workpiece 100 and the second workpiece 200, and may comprise any suitable material for bonding. In some embodiments, the first bonding layer 106 is a first passivation layer 106. The first passivation layer 106 may be formed of one or multiple layers comprising silicon oxide, silicon nitride, silicon oxynitride, silicon carbide, silicon oxycarbide, undoped silicon glass, phosphosilicate glass, compounds thereof, composites thereof, combinations thereof, or the like, deposited by any suitable method, such as spin-on, CVD, PECVD, or the like. These materials and processes are provided as examples and other materials and processes may be used.

It should also be noted that one or more etch stop layers (not shown) may be positioned between adjacent layers of the first workpiece 100, e.g., the first IMD layers 104 and the first substrate 102, or between individual layers of the first IMD layers 104. Generally, the etch stop layers provide a mechanism to stop an etching process when forming vias and/or contacts. The etch stop layers are formed of a dielectric material having a different etch selectivity from adjacent layers, e.g., the underlying first substrate 102 and the overlying first IMD layers 104. In an embodiment, etch stop layers may be formed of SiN, SiCN, SiCO, CN, combinations thereof, or the like, deposited by CVD or PECVD techniques.

In an embodiment, the first workpiece 100 is a backside illumination sensor (BIS) and the second workpiece 200 is an application-specific integrated circuit (ASIC) device. In this embodiment, the electrical circuitry includes photo active regions, such as photo-diodes formed by implanting impurity ions into the epitaxial layer. Furthermore, the photo active regions may be a PN junction photo-diode, a PNP photo-transistor, an NPN photo-transistor or the like. The BIS sensor may be formed in an epitaxial layer over a silicon substrate. The ASIC device may comprise a plurality of logic circuits such as an analog-to-digital converter, a data processing circuit, a memory circuit, a bias circuit, a reference circuit, any combinations thereof and/or the like.

In an embodiment, the first workpiece 100 and the second workpiece 200 are arranged with device sides (also referred as front sides) of the first substrate 102 and the second substrate 202 facing each other as illustrated in FIG. 1A. As discussed in greater detail below, an opening will be formed extending from a backside (opposite the device side) of the first workpiece 100 to the selected portions of the second conductive lines 208 of the second workpiece 200, such that portions of selected first conductive lines 108 of the first workpiece 100 will also be exposed. The opening will be subsequently filled with a conductive material, thereby forming an electrical contact on the backside of the first workpiece 100 to the conductive lines of the first workpiece 100 and the second workpiece 200.

Figure 1B:
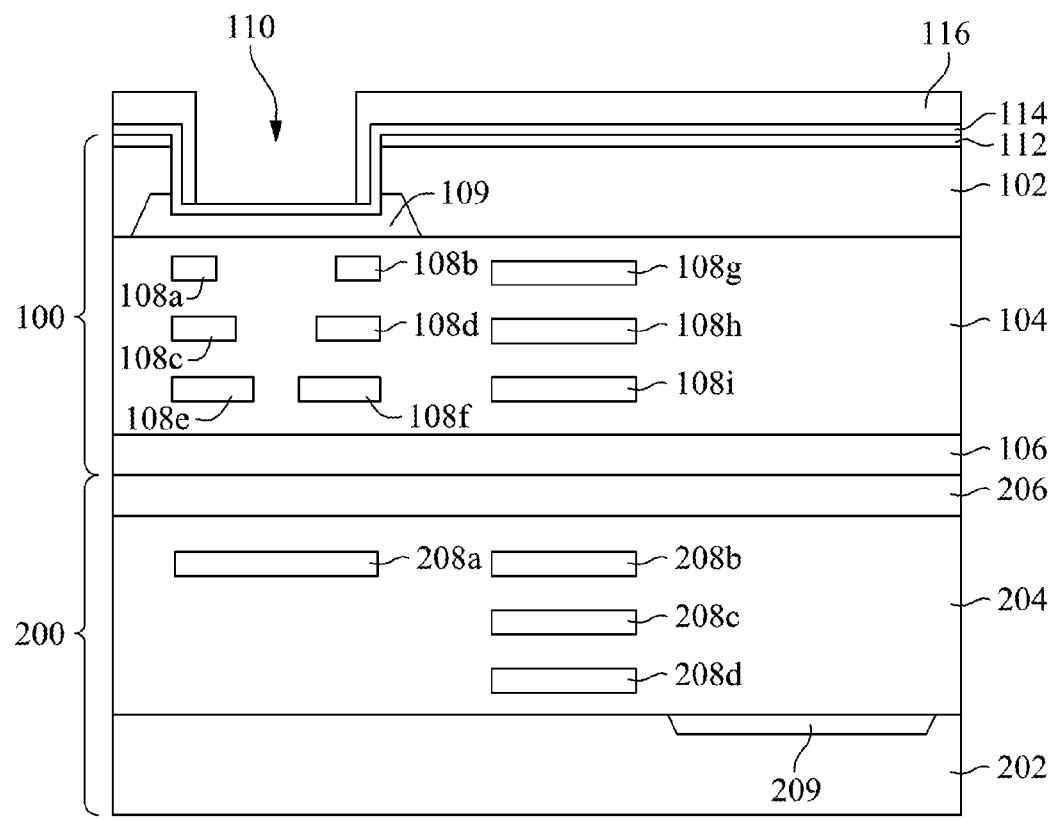

FIG. 1B illustrates the first workpiece 100 and the second workpiece 200 after bonding in accordance with an embodiment. As shown in FIG. 1A, the first workpiece 100 will be stacked and bonded on top of the second workpiece 200. In the illustrated embodiment, the first workpiece 100 and the second workpiece 200 are bonded using dielectric-to-dielectric bonding (e.g., oxide-to-oxide bonding) by bonding the first passivation layer 106 to the second passivation layer 206. In other embodiments, the first workpiece 100 and the second workpiece 200 may be bonded using, for example, a direct bonding process such as metal-to-metal bonding (e.g., copper-to-copper bonding), metal-to-dielectric bonding (e.g., oxide-to-copper bonding), hybrid bonding (e.g., dielectric-to-dielectric and metal-to-metal bonding), any combinations thereof and/or the like.

It should be noted that the bonding may be at wafer level, wherein the first workpiece 100 and the second workpiece 200 are bonded together, and are then singulated into separated dies. Alternatively, the bonding may be performed at the die-to-die level, or the die-to-wafer level.

After the first workpiece 100 and the second workpiece 200 are bonded, a thinning process may be applied to the backside of the first workpiece 100. In an embodiment in which the first substrate 102 is a BIS sensor, the thinning process serves to allow more light to pass through from the backside of the first substrate to the photo-active regions without being absorbed by the substrate. In an embodiment in which the BIS sensor is fabricated in an epitaxial layer, the backside of the first workpiece 100 may be thinned until the epitaxial layer is exposed. The thinning process may be implemented by using suitable techniques such as grinding, polishing, a SMARTCUT® procedure, an ELTRAN® procedure, and/or chemical etching.

Referring further to FIG. 1B, a first opening 110 is formed on the backside of the first workpiece 100. As discussed in greater detail below, an electrical connection will be formed extending from a backside of the first workpiece 100 to select ones of the second conductive lines 208 of the second workpiece 200. The first opening 110 represents an opening in which the backside contact will be formed. The first opening 110 may be formed using photolithography techniques. Generally, photolithography techniques involve depositing a photoresist material, which is subsequently irradiated (exposed) and developed to remove a portion of the photoresist material. The remaining photoresist material protects the underlying material from subsequent processing steps, such as etching. A suitable etching process, such as a reactive ion etch (RIE) or other dry etch, an anisotropic wet etch, or any other suitable anisotropic etch or patterning process may be applied to the first substrate 102 of the first workpiece 100. In the illustrated embodiment, the first STI region 109 is used as an etch stop layer, and the first opening 110 is formed in the first substrate 102 as illustrated in FIG. 1B. In some embodiments, the first STI region 109 may be partially etched as illustrated in FIG. 1B.

Also shown in FIG. 1B is an optional anti-reflection coating (ARC) layer 112. The ARC layer 112 reduces the reflection of the exposure light used during the photolithography process to pattern a patterned mask (not shown), which reflection may cause inaccuracies in the patterning. The ARC layer 112 may be formed of a nitride material (e.g., silicon nitride), an organic material (e.g., silicon carbide), an oxide material, high-k dielectric, and the like. The ARC layer 112 may be formed using suitable techniques such as CVD and/or the like.

Other layers may be used in the patterning process. For example, one or more optional hard mask layers may be used to pattern the first substrate 102. Generally, one or more hard mask layers may be useful in embodiments in which the etching process requires masking in addition to the masking provided by the photoresist material. During the subsequent etching process to pattern the first substrate 102, the patterned photoresist mask will also be etched, although the etch rate of the photoresist material may not be as high as the etch rate of the first substrate 102. If the etch process is such that the patterned photoresist mask would be consumed before the etching process is completed, then an additional hard mask may be utilized. The material of the hard mask layer or layers is selected such that the hard mask layer(s) exhibit a lower etch rate than the underlying materials, such as the materials of the first substrate 102.

Referring further to FIG. 1B, a dielectric film 114 is formed over the backside of the first substrate 102 and along sidewalls and a bottom of the first opening 110 in accordance with an embodiment. The dielectric film 114 provides greater passivation and isolation between through via structures and device circuits in addition to the one or more first STI regions 109. In some embodiments, the dielectric film 114 comprises a multilayer structure, which provides greater protection than a single film during, for example, a subsequent etch process to form electrical contacts to selected ones of the first conductive lines 108 and the second conductive lines 208. Additionally, the dielectric film 114 may provide protection against metal ions diffusing into the first substrate 102 and the dielectric layers.

The dielectric film 114 may be formed of various dielectric materials commonly used in integrated circuit fabrication. For example, the dielectric film 114 may be formed of silicon dioxide, silicon nitride or a doped glass layer such as boron silicate glass and the like. Alternatively, dielectric layer may be a layer of silicon nitride, silicon oxynitride, polyamide, a low-k dielectric, or a high-k dielectric, or the like. In addition, a combination of the foregoing dielectric materials may also be used to form the dielectric film 114. In some embodiments, the dielectric film 114 may be formed using suitable techniques such as sputtering, oxidation, CVD and/or the like.

FIG. 1B further illustrates a patterned mask 116 formed over the backside of the first substrate 102 in accordance with an embodiment. The patterned mask 116 may be, for example, a photoresist material that has been deposited, masked, exposed, and developed as part of a photolithography process. The patterned mask 116 is patterned to define a via opening extending through the one or more first STI regions 109 of the first substrate 102, the first IMD layers 104 of the first substrate 102 and at least some of the second IMD layers 204 of the second substrate 202, thereby exposing portions of select ones of the first conductive lines 108 and the second conductive lines 208, as explained in greater detail below.

Figure 1C:
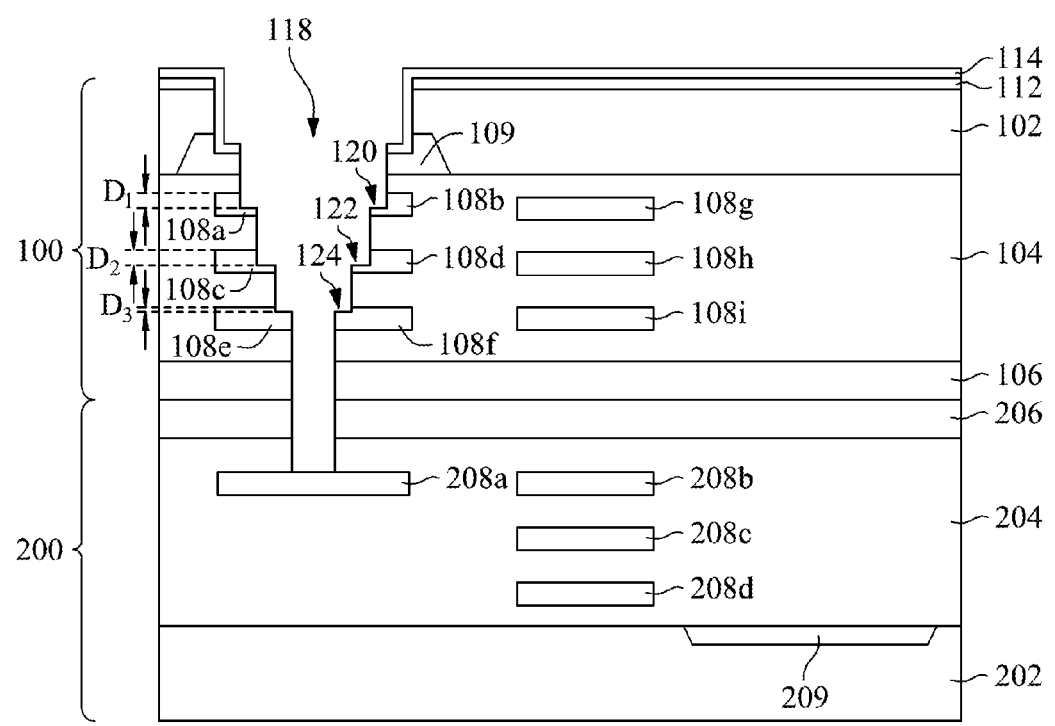

FIG. 1C illustrates the semiconductor device shown in FIG. 1B after one or more additional etching processes are performed in accordance with an embodiment. A suitable etching process, such as a dry etch, an anisotropic wet etch, or any other suitable anisotropic etch or patterning process, may be performed on the semiconductor device to form a second opening 118.

As illustrated in FIG. 1C, the second opening 118 extends the first opening 110 to the first conductive lines 108a and 108b, the first conductive lines 108c and 108d, the first conductive lines 108e and 108f, and to the second conductive line 208a. In an embodiment, the first conductive lines 108 are formed of suitable metal materials such as copper, which exhibits a different etching rate (selectivity) than the first IMD layers 104. As such, the first conductive lines 108a and 108b as well as the first conductive lines 108c and 108d, and the first conductive lines 108e and 108f function as hard mask layers for an etching process of the first IMD layers 104. A selective etching process may be employed to etch the first IMD layers 104 rapidly while etching only portions of the first conductive lines 108a through 108f in some embodiments. In some embodiments, some or all of the first conductive lines 108 may be dummy conductive lines and may not provide electrical connection between the electrical circuits of the first workpiece 100.

As shown in FIG. 1C, the exposed portion of the first conductive lines 108a and 108b may be partially etched away, thereby forming a first recess 120, as the etch process continues toward the first conductive lines 108c and 108d. The exposed portion of the first conductive lines 108c and 108d may be partially etched, thereby forming a second recess 122, as the etch process continues toward the first conductive lines 108e and 108f. The exposed portion of the first conductive lines 108e and 108f may be partially etched, thereby forming a third recess 124, as the etch process continues toward the second conductive line 208a. Depths of the first recess 120, the second recess 122, and the third recess 124 may vary depending on a variety of applications and design needs.

The selective etch process continues until the second conductive line 208a is exposed, thereby forming a combined opening extending from a backside of the first workpiece 100 to the second conductive line 208a of the second workpiece 200 as illustrated in FIG. 1C.

In the illustrated embodiment, the first conductive lines 108a and 108b are subject to the etch process longer than the first conductive lines 108c and 108d, and the first conductive lines 108c and 108d are subject to the etch process longer than the first conductive lines 108e and 108f. Therefore, a first depth $D_1$ of the first recess 120 is larger than a second depth $D_2$ of the second recess 122, and the second depth $D_2$ of the second recess 122 is larger than a third depth $D_3$ of the third recess 124.

It should be noted that the selective etch process may extend through a variety of various layers used to form the one or more first STI regions 109, the first IMD layers 104, the second IMD layers 204, the first passivation layer 106, and the second passivation layer 206, which may include various types of materials and etch stop layers. Accordingly, the selective etch process may utilize multiple etchants to etch through the various layers, wherein the etchants are selected based upon the materials being etched.

In some embodiments, the patterned mask 116 may be fully consumed during the selective etch process described above. In other embodiments, a portion of the patterned mask 116 may still remain on the backside of the first workpiece 100 after the selective etch process is completed. The remaining patterned mask 116 may be removed by using suitable stripping techniques such as chemical solvent cleaning, plasma ashing, dry stripping and/or the like. The techniques are well known and hence are not discussed in further detail herein to avoid repetition.

Figure 1D:
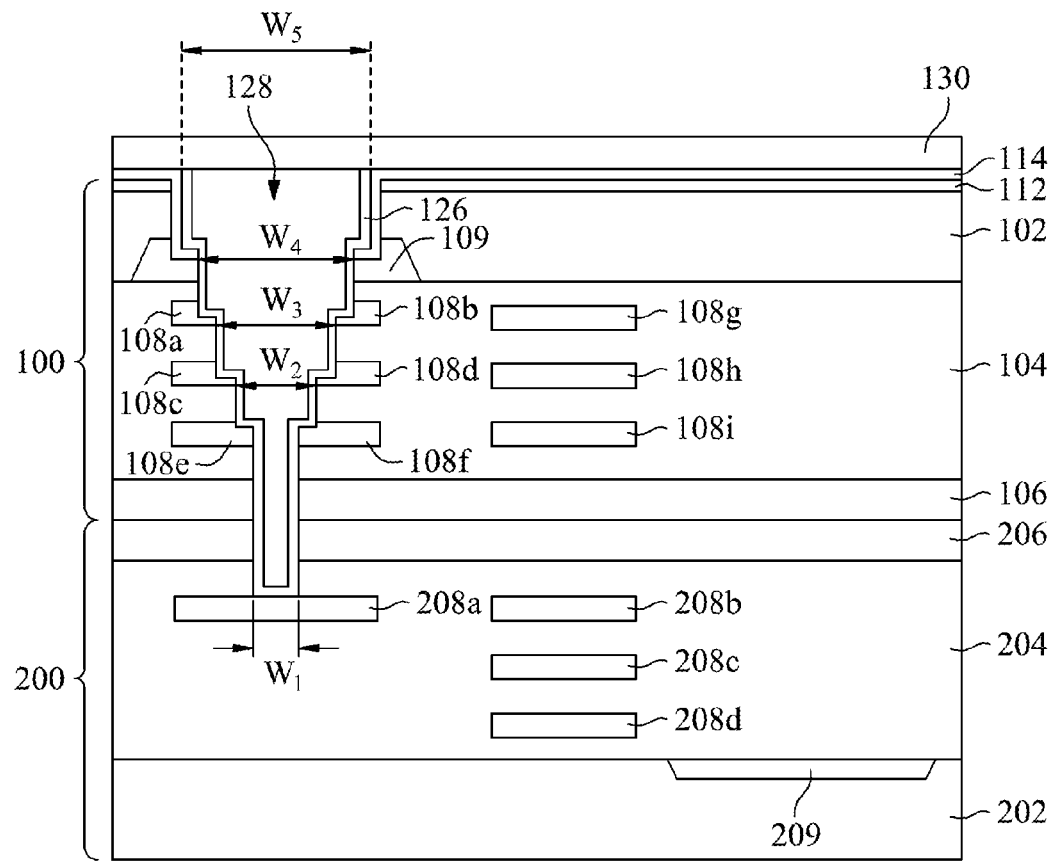

FIG. 1D illustrates conductive materials formed within the first opening 110 and the second opening 118 in accordance with various embodiments. In some embodiments, the conductive materials may be formed by depositing one or more diffusion and/or barrier layers and depositing a seed layer (not shown). For example, a diffusion barrier layer 126 comprising one or more layers of Ta, TaN, TiN, Ti, CoW, or the like is formed along the sidewalls of the first opening 110 and the second opening 118. The seed layer may be formed of copper, nickel, gold, any combination thereof and/or the like. The diffusion barrier layer and the seed layer may be formed by suitable deposition techniques such as PVD, CVD and/or the like. Once the seed layer has been deposited in the openings, a conductive material, such as tungsten, titanium, aluminum, copper, any combinations thereof and/ or the like, is filled into the first opening 110 and the second opening 118, using, for example, an electro-chemical plating process, thereby forming a conductive plug 128 (also referred as a trough oxide via (TOV)).

FIG. 1D also illustrates removal of excess materials, e.g., excess conductive materials, from the backside of the first substrate 102. In some embodiments, the dielectric film 114 may be left along the backside of the first substrate 102 to provide additional protection from the environment. In the example illustrated in FIG. 1D, the dielectric film 114 remains on the backside of the first substrate 102. In this example, the excess materials may be removed using an etch process, a planarization process (e.g., a CMP process), or the like, using the dielectric film 114 as a stop layer.

FIG. 1D further illustrates a dielectric capping layer 130 formed along a backside of the first workpiece 100. In some embodiments, the dielectric capping layer 130 is similar to the first passivation layer 106 described above, is formed using similar materials and methods, and the description is not repeated herein.

In some embodiments, the conductive plug 128 provides electrical connection between some or all of the first conductive lines 108a-108f and the second conductive line 208a, which in turn provides electrical connection between electrical circuits of the first workpiece 100 and the second workpiece 200. For example, the conductive plug 128 may electrically connect the backside of the first substrate 102 to the second conductive line 208a, the first conductive lines 108a-108f to the second conductive line 208a, or the backside of the first substrate 102 to the first conductive lines 108a-108f and the second conductive line 208a.

As shown in FIG. 1D, the conductive plug 128 comprises five portions. A first portion is from the second conductive line 208a to the first conductive lines 108e and 108f. The first portion is of a first width $W_1$ as shown in FIG. 1D. A second portion is from the first conductive lines 108e and 108f to the first conductive lines 108c and 108d. The second portion is of a second width $W_2$ as shown in FIG. 1D. A third portion is from the first conductive lines 108c and 108d to the first conductive lines 108a and 108b. The third portion is of a third width $W_3$ as shown in FIG. 1D. A fourth portion is from the first conductive lines 108a and 108b to the front side of the first substrate 102. The fourth portion is of a fourth width $W_4$ as shown in FIG. 1D. A fifth portion is from the front side of the first substrate 102 to the backside of the first substrate 102. The fifth portion has the fourth width $W_4$ and a fifth width $W_5$ as shown in FIG. 1D.

In some embodiments, the fifth width $W_5$ is greater than the fourth width $W_4$, the fourth width $W_4$ is greater than the third width $W_3$, the third width $W_3$ is greater than the second width $W_2$, and the second width $W_2$ is greater than the first width $W_1$. The first width $W_1$ may be between about 0.4 μm and about 2.0 μm. The second width $W_2$ may be between about 0.6 μm and about 4.0 μm. The third width $W_3$ may be between about 0.8 μm and about 6.0 μm. The fourth width $W_4$ may be between about 1.0 μm and about 8.0 μm. The fifth width $W_5$ may be between about 1.2 μm and about 11 μm.

It should further be noted while FIGS. 1A-1D illustrate conductive lines (e.g., the first conductive lined 108a-108f) that function as hard mask layers, one skilled in the art will recognize that other features may also be used as hard mask layers. For example, a plurality of isolation regions, polysilicon regions, any combinations thereof and/or the like may be used as the hard mask layers.

Figure 1E:
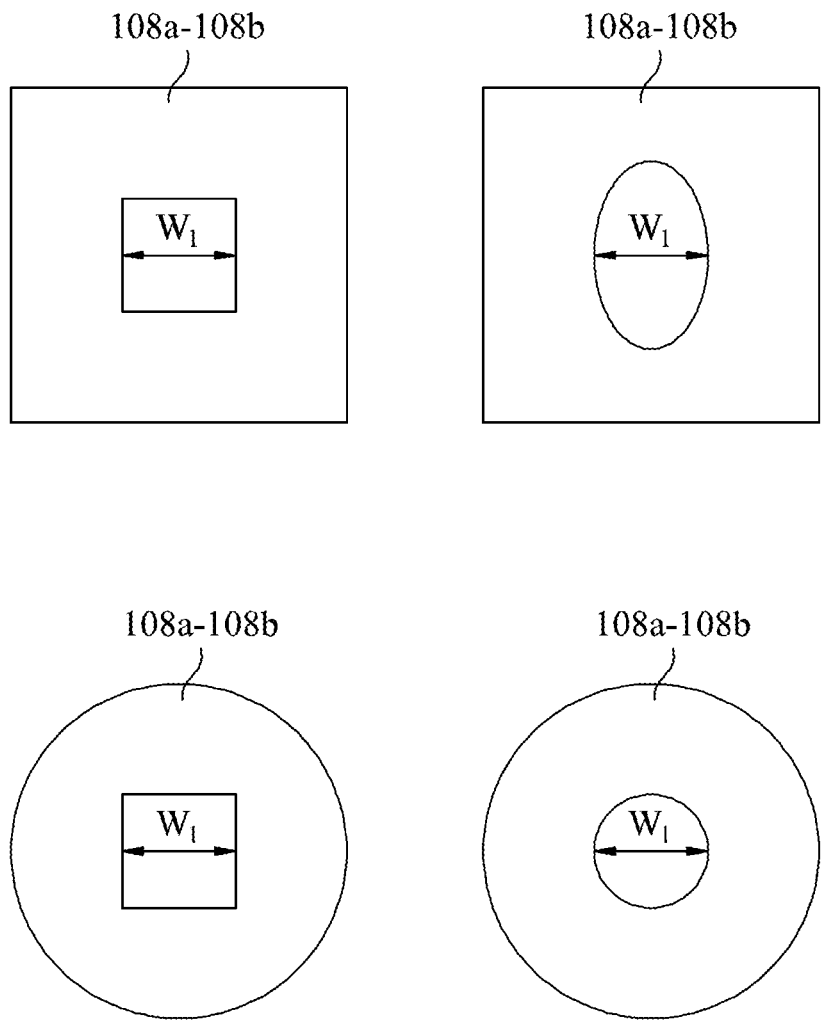
FIG. 1E illustrates various top views of conductive lines in accordance with some embodiments.

FIG. 1E illustrates exemplary top views of the first conductive lines 108a and 108b in accordance with various embodiments of the present disclosure. While the cross sectional views of the first conductive lines 108a and 108b show that the first conductive line 108a and the first conductive line 108b are two separate conductive lines (see FIGS. 1A-1D), the first conductive lines 108a and 108b may form a continuous annular shaped region as viewed from top as shown in FIG. 1E. In the illustrated embodiment, the inside diameter of the annular shaped region is equal to the third width $W_3$.

It should be noted that inside and outside surfaces of the annular shaped regions as illustrated in FIG. 1E are for illustrative purpose only and the inside and outside surfaces may have variety of shapes, such as square, circle, oval, triangular, polygonal and/or the like. In some embodiments, the first conductive lines 108c and 108d, and the first conductive lines 108e and 108f may also form annular shaped regions as viewed from top. The annular shapes of the first conductive lines 108c and 108d, and the first conductive lines 108e and 108f may be similar to those illustrated in FIG. 1E. However, inside diameters of the annular shaped regions for the first conductive lines 108c and 108d, and the first conductive lines 108e and 108f are equal to the second width $W_2$ and the first width $W_1$, respectively.

Figure 2:
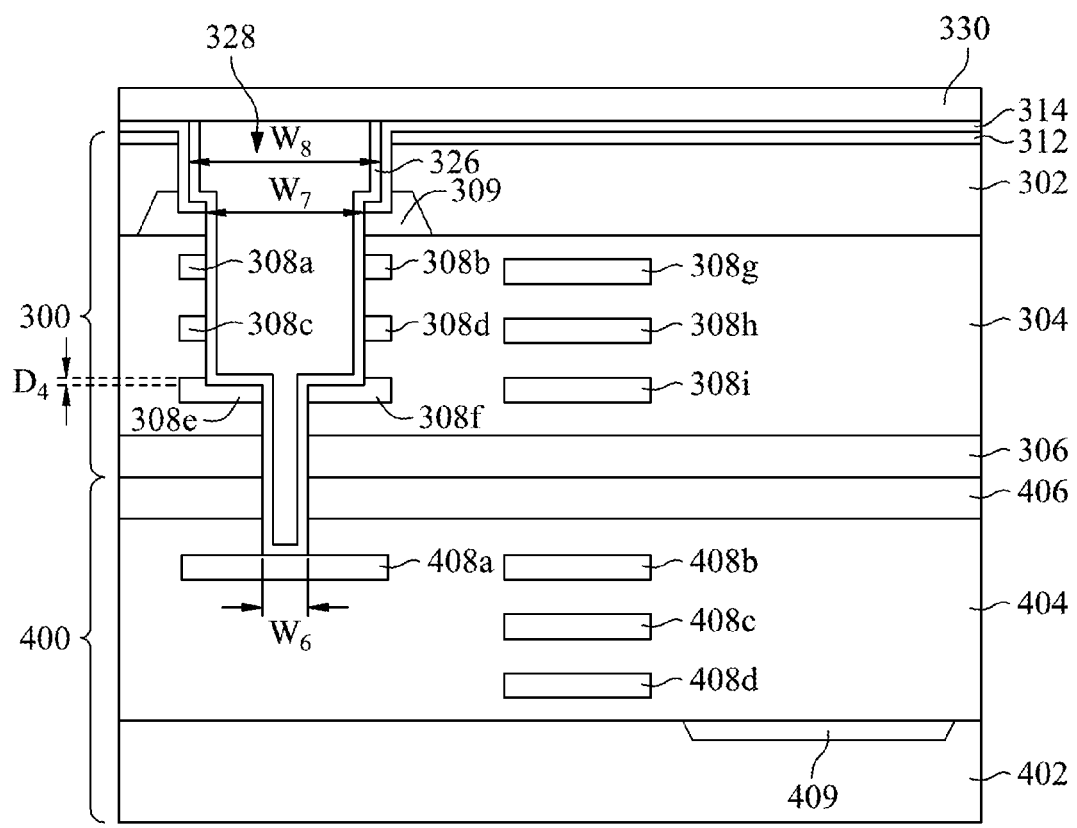
FIGS. 2-3I are cross-sectional views of an interconnect structure between two bonded workpieces in accordance with some embodiment.

FIG. 2 illustrates an interconnect structure between two bonded workpieces in accordance with some embodiments. In what follows, unless otherwise noted, features of FIG. 2 having reference numerals of the form "3xx" and "4xx" are similar to features of FIGS. 1A-1E having reference numerals "1xx" and "2xx," respectively. For example, an "<element>3xx" of FIG. 2 corresponds to an "<element>1xx" of FIGS. 1A-1E, and an "<element>4xx" of FIG. 2 corresponds to an "<element>2xx" of FIGS. 1A-1E.

Referring further to FIG. 2, a conductive plug 328 interconnecting a first workpiece 300 and a second workpiece 400 is illustrated. In the illustrated embodiment, the first workpiece 300 and the second workpiece 400 and bonded and the conductive plug 328 is formed, for example, using methods as described above with reference to FIGS. 1A-1D and the description is not repeated herein.

As the technology node shrinks, dimensions of various features of semiconductor devices are also reduced. In the embodiment illustrated in FIG. 2, the first conductive lines 308a-308f may be so thin that at least some of the first conductive lines 308a-308f will be fully etched during the selective etch process. As shown in FIG. 2, the first conductive lines 308a-308d may be fully etched away and may fail to reduce a width of the conductive plug 328 as the etch process continues toward the first conductive lines 108e and 108f. In the illustrated embodiment, the first conductive lines 108a-108d are subject to the selective etch process longer than the first conductive lines 108e and 108f. Accordingly, the first conductive lines 108a-108d are fully etched away while the first conductive lines 108e and 108f are partially etched, thereby forming a recess having a fourth depth $D_4$. The fourth depth $D_4$ may vary depending on a variety of applications and design needs.

As shown in FIG. 2, the conductive plug 328 comprises three portions. A first portion is from the second conductive line 408a to the first conductive lines 308e and 308f. The first portion is of a sixth width $W_6$ as shown in FIG. 2. A second portion is from the first conductive lines 308e and 308f to the front side of the first substrate 302. The second portion is of a seventh width $W_7$ as shown in FIG. 2. A third portion is from the front side of the first substrate 302 to the backside of the first substrate 302. The third portion has the seventh width $W_7$ and a eighth width $W_8$ as shown in FIG. 2.

In some embodiments, the eighth width $W_8$ is greater than the seventh width $W_7$, and the seventh width $W_7$ is greater than the sixth width $W_6$. The sixth width $W_6$ may be between about 0.4 µm and about 2.0 µm. The seventh width $W_7$ may be between about 0.6 µm and about 8.0 µm. The eighth width $W_8$ may be between about 1.2 µm and about 11 µm.

As shown in FIG. 2, the first conductive line 308a and the first conductive line 308b are two separate conductive lines. However, in some embodiments, the first conductive lines 308a and 308b may form a continuous annular shaped region, similar to one described above with respect to FIG. 1E. In the illustrated embodiment, the inside diameter of the annular shaped region for the first conductive lines 308a and 308b is equal to the seventh width $W_7$. In some embodiments, the first conductive lines 308c and 308d, and the first conductive lines 308e and 308f may also form annular shaped regions as viewed from top. In the illustrated embodiment, inside diameters of the annular shaped regions for the first conductive lines 308c and 308d, and the first conductive lines 308e and 308f are equal to the seventh width $W_7$ and the sixth width $W_6$, respectively FIGS. 3A-3H illustrate an interconnect structure between two bonded workpieces in accordance with some embodiments. In what follows, unless otherwise noted, features of FIGS. 3A-3H having reference numerals of the form "5xx" and "6xx" are similar to features of FIGS. 1A-1E having reference numerals "1xx" and "2xx," respectively. For example, an "<element>5xx" of FIGS. 3A-3H corresponds to an "<element>1xx" of FIGS. 1A-1E, and an "<element>6xx" of FIGS. 3A-3H corresponds to an "<element>2xx" of FIGS. 1A-1E.

Figure 3A:
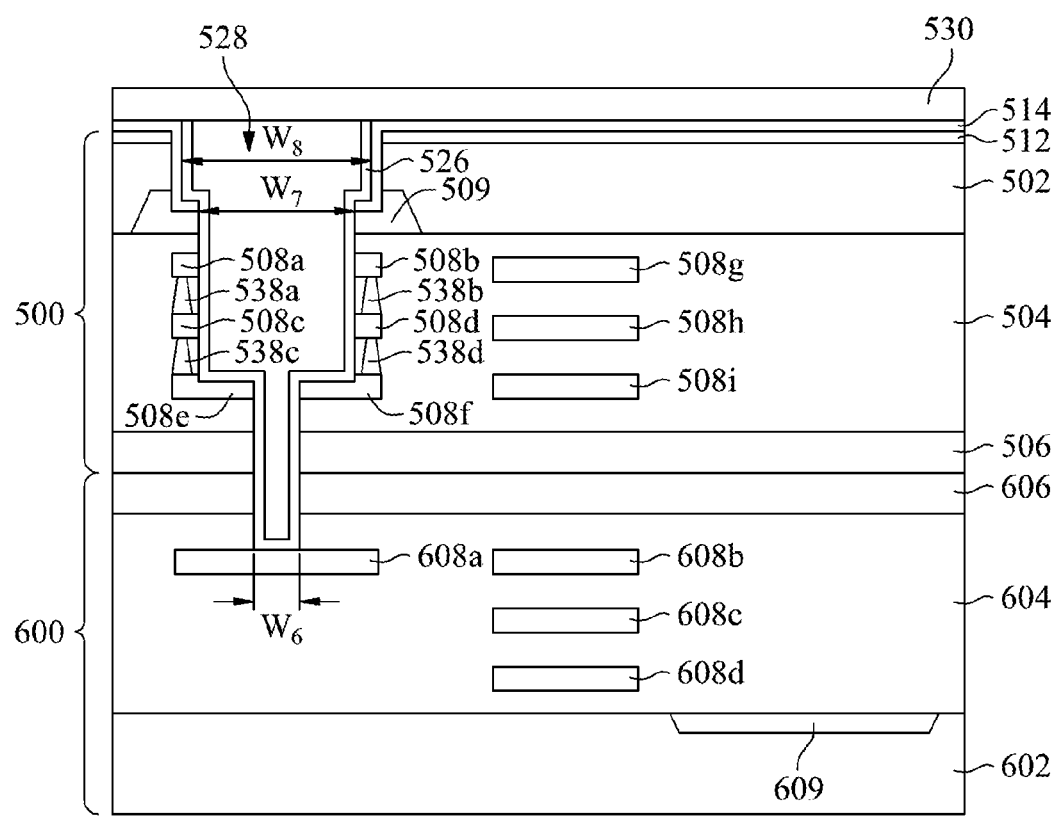

Referring first to FIG. 3A, a conductive plug 528 interconnecting a first workpiece 500 and a second workpiece 600 is illustrated. In the illustrated embodiment, the first workpiece 500 and the second workpiece 600 are bonded and the conductive plug 528 is formed, for example, using methods as described above with reference to FIGS. 1A-1D and the description is not repeated herein.

Referring further to FIG. 3A, an embodiment similar to one shown in FIG. 2 is illustrated. In the illustrated embodiment, in addition to first conductive lines 508, first conductive vias 538a-538d (collectively referred as first conductive vias 538) are formed within the first IMD layers 504. In some embodiments, the first conductive vias 538 may be formed using, for example, materials and methods described above with respect to the first conductive lines 108 of FIG. 1A, and the description is not repeated herein. In the illustrated embodiment, the first conductive vias 538 electrically interconnect the first conductive lines 508. In some embodiments, the first conductive vias 538 may also function as hard mask layers and may aid in forming a conductive plug 528.

As shown in FIG. 3A, the conductive plug 528 comprises three portions. A first portion is from the second conductive line 608a to the first conductive lines 508e and 508f. The first portion is of the sixth width $W_6$ as shown in FIG. 3A.

A second portion is from the first conductive lines 508e and 508f to the front side of the first substrate 502. The second portion is of the seventh width $W_7$ as shown in FIG. 3A. A third portion is from the front side of the first substrate 502 to the backside of the first substrate 502. The third portion has the seventh width $W_7$ and the eighth width $W_8$ as shown in FIG. 3A.

As shown in FIG. 3A, the first conductive line 508a and the first conductive line 508b are two separate conductive lines. However, in some embodiments, the first conductive lines 508a and 508b may form a continuous annular shaped region, similar to one described above with respect to FIG. 1E. In the illustrated embodiment, the inside diameter of the annular shaped region for the first conductive lines 508a and 508b is equal to the seventh width $W_7$. In some embodiments, the first conductive lines 508c and 508d, and the first conductive lines 508e and 508f may also form annular shaped regions as viewed from top. In the illustrated embodiment, inside diameters of the annular shaped regions for the first conductive lines 508c and 508d, and the first conductive lines 508e and 508f are equal to the seventh width $W_7$ and the sixth width $W_6$, respectively In some embodiments, the first conductive vias 538a and 538b, and the first conductive vias 538c and 538d may also form annular shaped regions as viewed from top. In the illustrated embodiment, inside diameters of the annular shaped regions for the first conductive vias 538a and 538b, and the first conductive vias 538c and 538d are larger than the seventh width $W_7$, and, in this embodiment, the first conductive lines 508a-508f function as hard mask layers.

In some embodiments, the first conductive lines 508 and first conductive vias 538 collectively form a seal ring structure surrounding the conductive plug 528. In addition to one or more barrier layers 526, the seal ring structure may protect the first IMD layers 504 from diffusion of a conductive material forming the conductive plug 528.

Figure 3B:
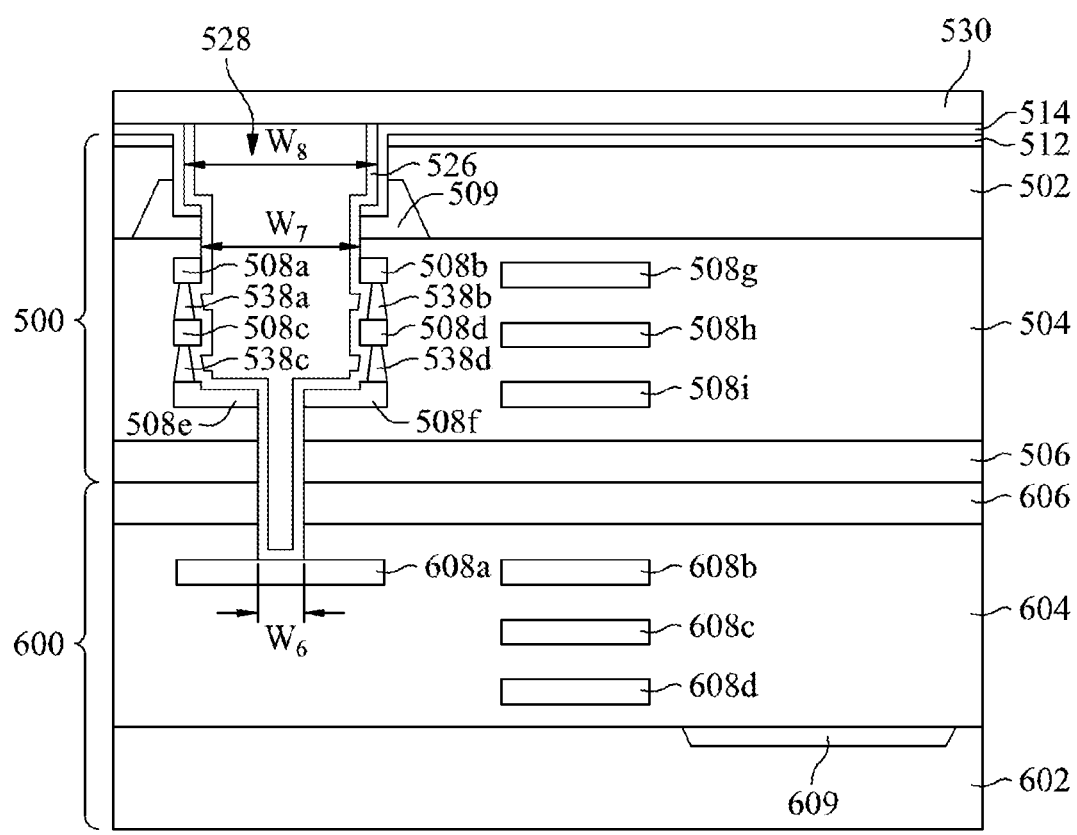

As illustrated in FIG. 3A, portions of the first IMD layers 504 are interposed between the conductive plug 528 and the first conductive vias 538a-538d. In some embodiments, the first IMD layers 504 may be laterally etched while forming an opening in the first IMD layers 504 for the conductive plug 528. Furthermore, individual dielectric layers of the first IMD layers 504 may have different etch rates. In some embodiments, dielectric layers of the first IMD layers 504 that are interposed between the first conductive lines 508a, 508b and 508g and the first passivation layer 506 have higher etch rates than dielectric layers of the first IMD layers 504 that are interposed between the first substrate 502 and the first conductive lines 508a, 508b and 508g. An example of such an embodiment is illustrated in FIG. 3B, wherein the first conductive lines 508a-508f function as hard mask layers, and portions of the first IMD layers 504 enclosed by annular shaped regions formed of the first conductive vias 538a-538b and the first conductive vias 538c-538d are fully etched by a lateral etch process, while portions of the first IMD layers 504 interposed between the first conductive lines 508a-508b and the first substrate 502 are not substantially etched by the lateral etch process. In the illustrated embodiment, the conductive plug 528 is in direct electrical contact with the first conductive vias 538a-538d. In alternative embodiments, the lateral etch process may not fully remove the portions of the first IMD layers 504 enclosed by the annular shaped regions formed of the first conductive vias 538a-538b and the first conductive vias 538c-538d depending on inside diameters of the annular shaped regions. In such embodiments, portions of the first IMD layers 504 remain interposed between the conductive plug 528 and the first conductive vias 538a-538d.

Figure 3C:
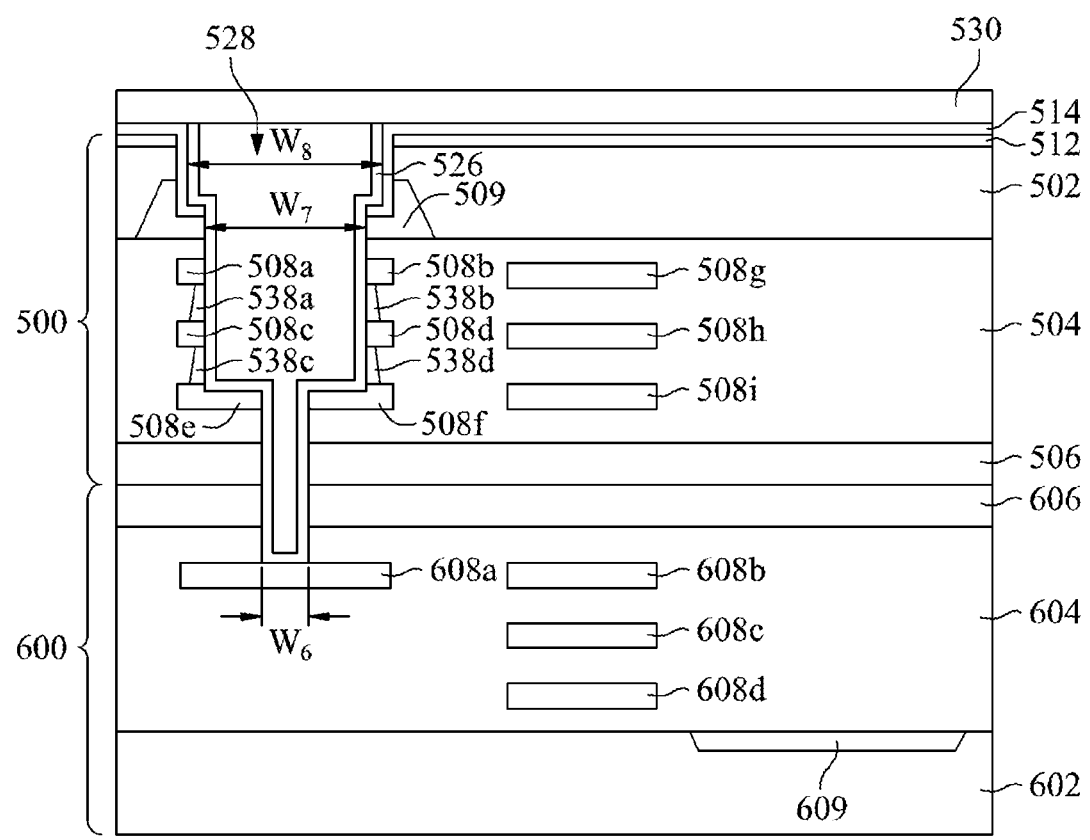

Referring to FIG. 3C, an embodiment similar to one shown in FIG. 3A is illustrated. In the illustrated embodiment, inside diameters of annular shaped regions for the first conductive lines 508a and 508b, the first conductive lines 508c and 508d, and the first conductive lines 508e and 508f are equal to the seventh width $W_7$, the seventh width $W_7$, and the sixth width $W_6$, respectively. In addition, inside diameters of annular shaped regions for the first conductive vias 538a and 538b, and the first conductive vias 538c and 538d are equal to the seventh width $W_7$, and, in this embodiment, the first conductive lines 508a-508f and the first conductive vias 538a-538d function as hard mask layers.

Figure 3D:
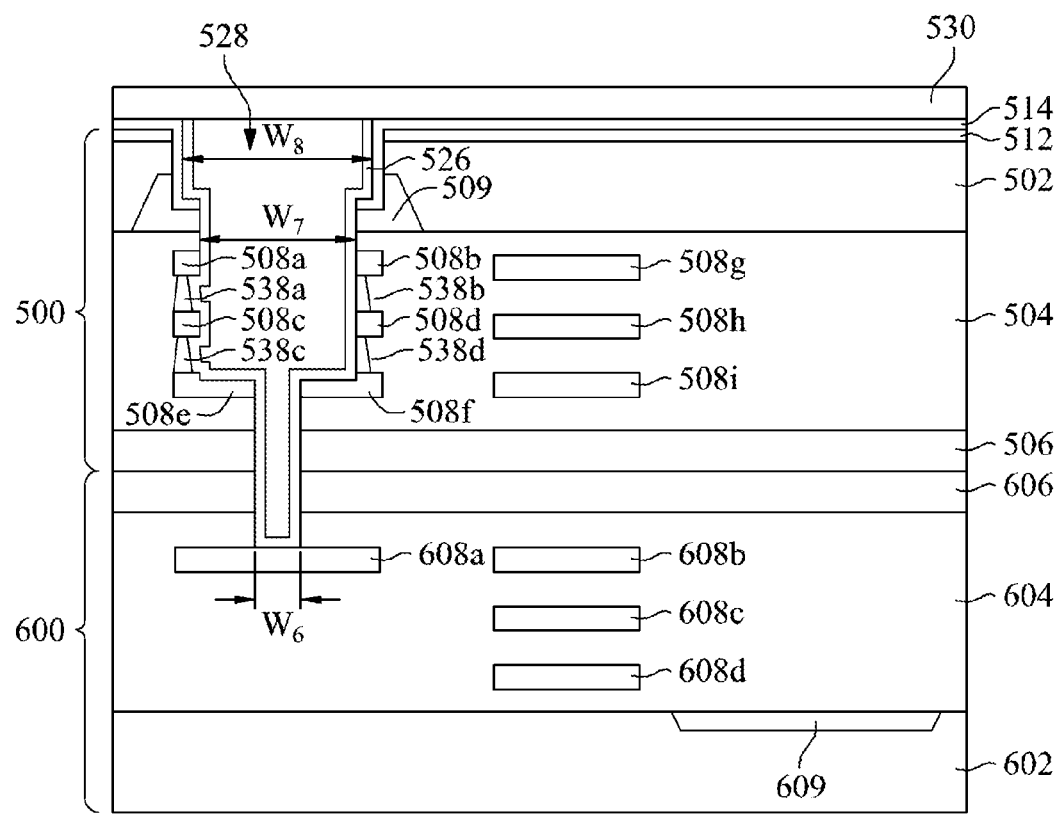

Referring to FIG. 3D, an embodiment is illustrated, wherein the first conductive lines 508a-508f and the first conductive vias 538b and 538d function as hard mask layers. In the illustrated embodiment, portions of the first IMD layers 504 adjacent to the first conductive vias 538a and 538c are fully etched by a lateral etch process, and the conductive plug 528 is in direct electrical contact with the first conductive vias 538a and 538c. As shown in FIG. 3D, inside diameters of annular shaped regions for the first conductive lines 508a and 508b, and the first conductive lines 508c and 508d, are equal to the seventh width $W_7$, and an inside diameter of an annular shaped region for the first conductive lines 508e and 508f is equal to the sixth width $W_6$.

Figure 3E:
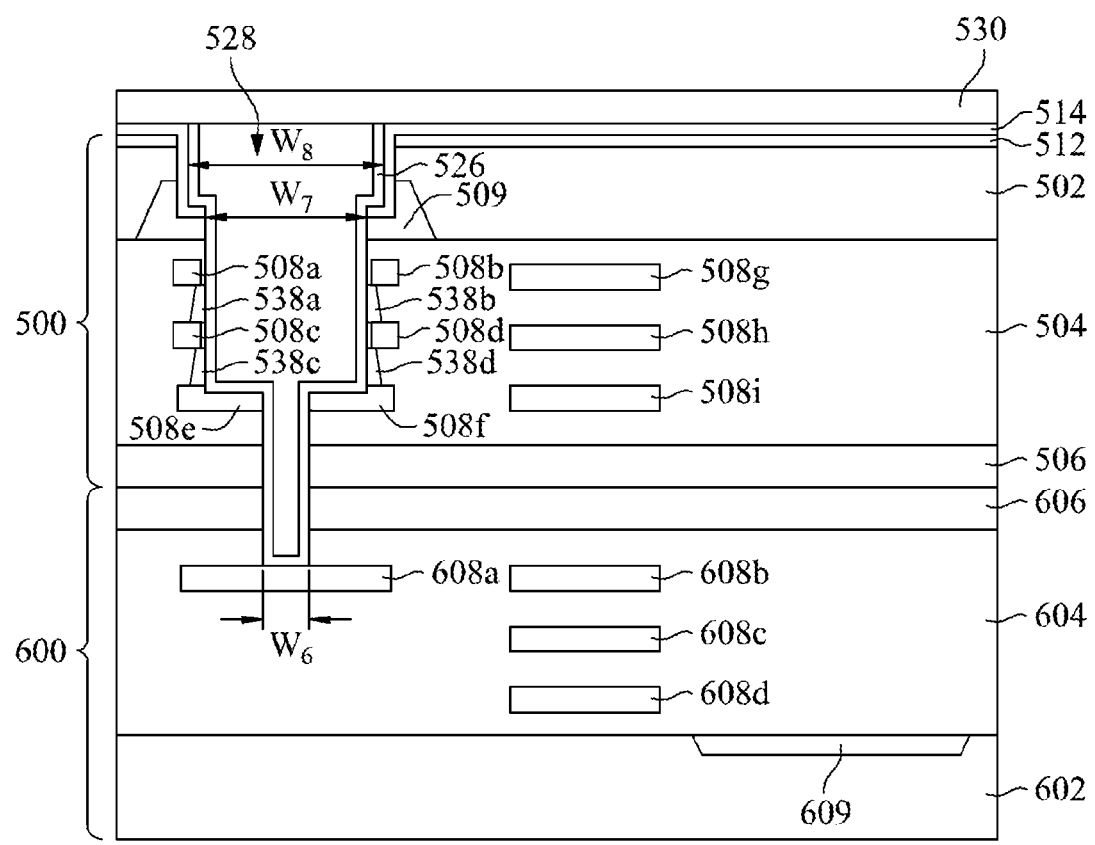

Referring to FIG. 3E, an embodiment is illustrated, wherein inside diameters of annular shaped regions for the first conductive lines 508a and 508b, and the first conductive lines 508c and 508d, are larger than the seventh width $W_7$, and an inside diameter of an annular shaped region for the first conductive lines 508e and 508f is equal to the sixth width $W_6$. In addition, inside diameters of annular shaped regions for the first conductive vias 538a and 538b, and the first conductive vias 538c and 538d are equal to the seventh width $W_7$, and, in this embodiment, the first conductive lines 508e-508f and the first conductive vias 538a-538d function as hard mask layers.

Figure 3F:
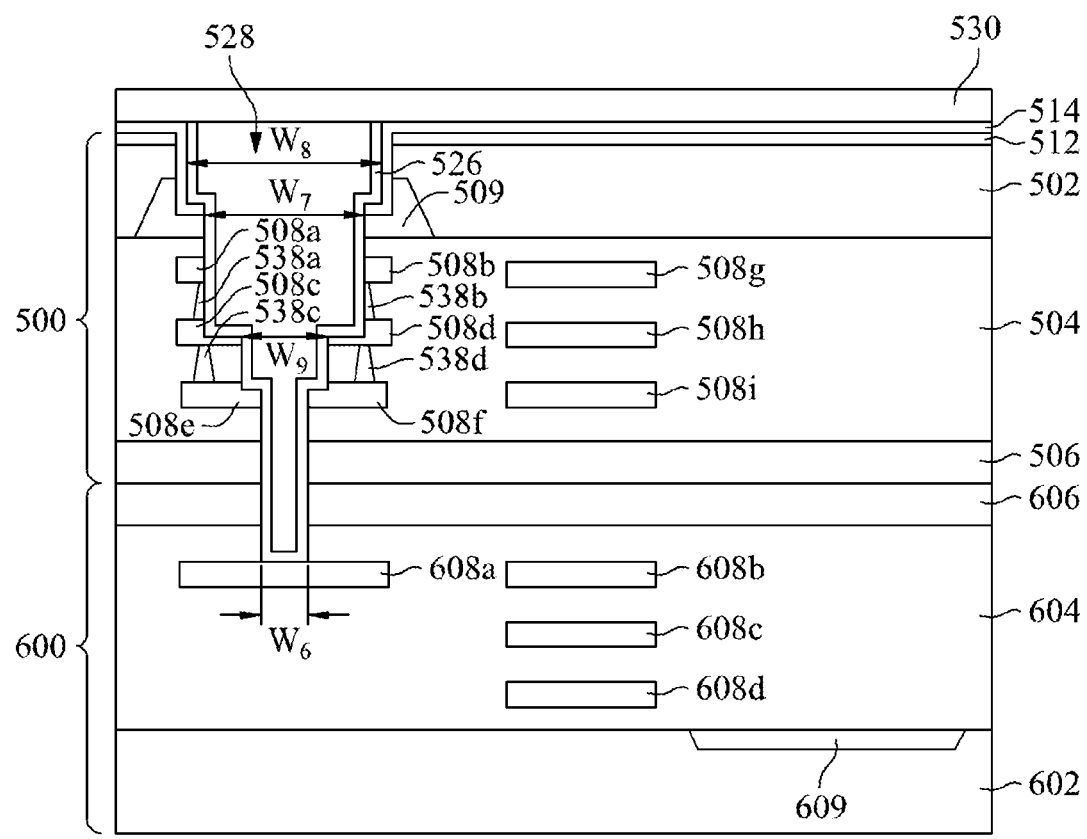

Referring to FIG. 3F, an embodiment is illustrated, wherein the conductive plug 528 comprises four portions. A first portion is from the second conductive line 608a to the first conductive lines 508e and 508f. The first portion is of the sixth width $W_6$ as shown in FIG. 3F. A second portion is from the first conductive lines 508e and 508f to the first conductive lines 508c and 508d. The second portion is of a ninth width $W_9$ as shown in FIG. 3F. In some embodiments, the ninth width $W_9$ is between about 0.6 μm and about 4.0 μm. A third portion is from the first conductive lines 508c and 508d to the front side of the first substrate 502. The third portion is of the seventh width $W_7$ as shown in FIG. 3F. A fourth portion is from the front side of the first substrate 502 to the backside of the first substrate 502. The fourth portion has the seventh width $W_7$ and the eighth width $W_8$ as shown in FIG. 3F. In the illustrated embodiment, the first conductive lines 508a-508f and the first conductive vias 538a and 538b function as hard mask layers, and the first conductive lines 508c-508f are partially etched.

Figure 3G:
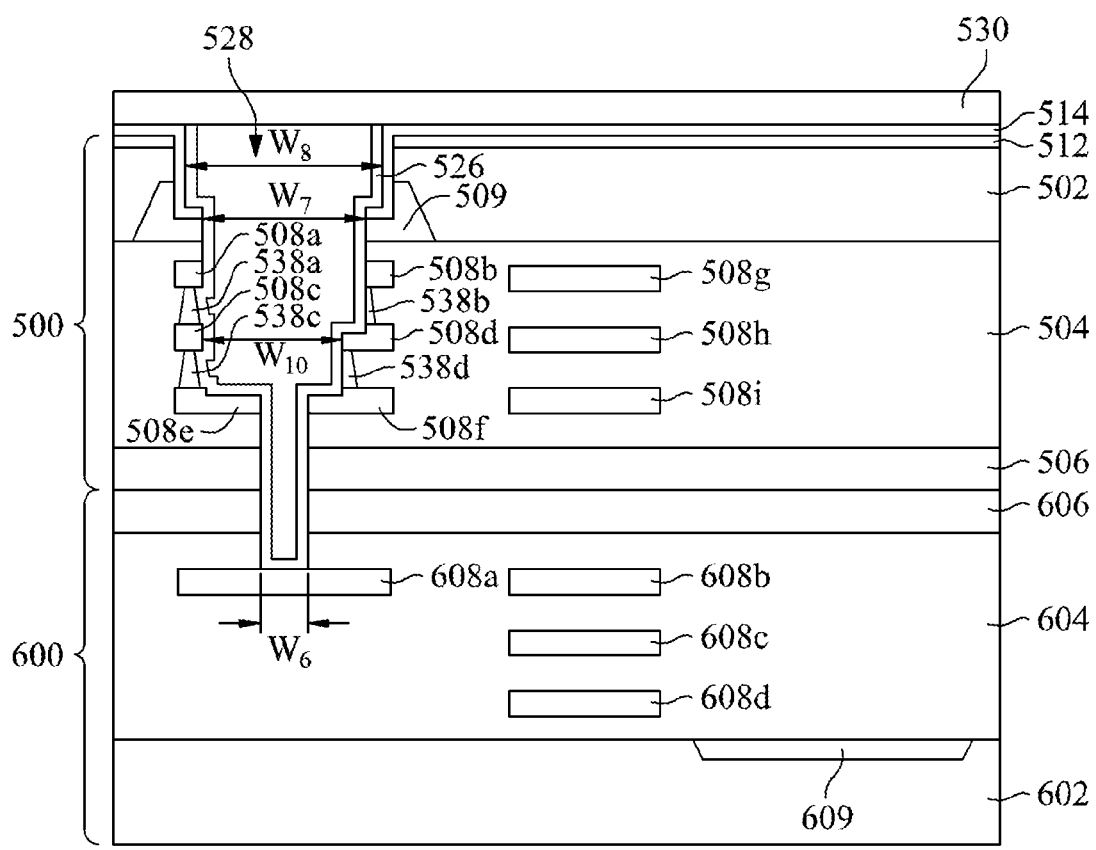

Referring to FIG. 3G, an embodiment is illustrated, wherein the conductive plug 528 has an asymmetric shape and comprises four portions. A first portion is from the second conductive line 608a to the first conductive lines 508e and 508f. The first portion is of the sixth width $W_6$ as shown in FIG. 3G. A second portion is from the first conductive lines 508e and 508f to the first conductive lines 508c and 508d. The second portion is of a tenth width $W_{10}$ as shown in FIG. 3G. In some embodiments, the tenth width $W_{10}$ is between about 0.6 μm and about 4.0 μm. A third portion is from the first conductive lines 508c and 508d to the front side of the first substrate 502. The third portion is of the seventh width $W_7$ as shown in FIG. 3G. A fourth portion is from the front side of the first substrate 502 to the backside of the first substrate 502. The fourth portion has the seventh width $W_7$ and the eighth width $W_8$ as shown in FIG. 3G. In the illustrated embodiment, the first conductive lines 508a-508f and the first conductive vias 538b and 538d function as hard mask layers, and the first conductive lines 508d-508f are partially etched.

Figure 3H:
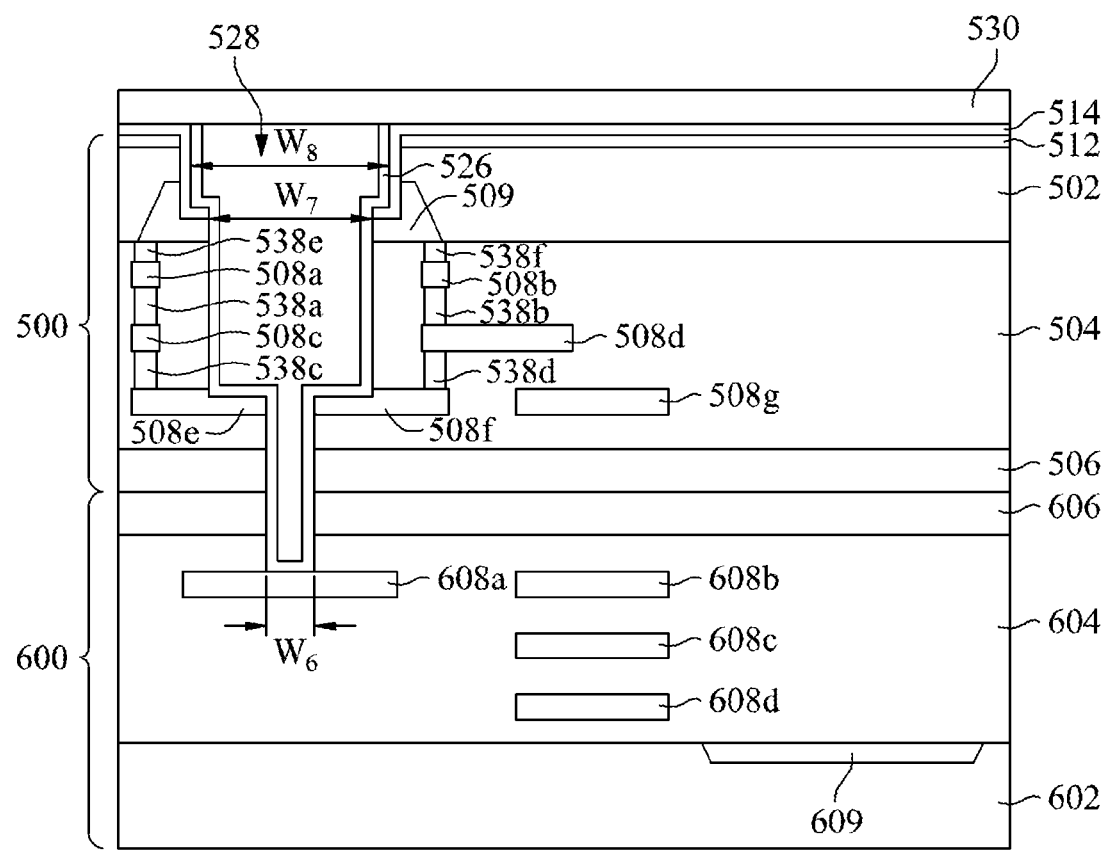

Referring to FIG. 3H, an embodiment is illustrated, wherein inside diameters of annular shaped regions for the first conductive lines 508a and 508b, and the first conductive lines 508c and 508d are larger than the seventh width $W_7$, and an inside diameter of an annular shaped region for the first conductive lines 508e and 508f is equal to the sixth width $W_6$. In addition, inside diameters of the annular shaped regions for the first conductive vias 538a and 538b, the first conductive vias 538c and 538d, and first conductive vias 538e and 538f are larger than the seventh width $W_7$, and, in this embodiment, the first conductive lines 508e and 508f function as a hard mask layer.

Figure 3I:
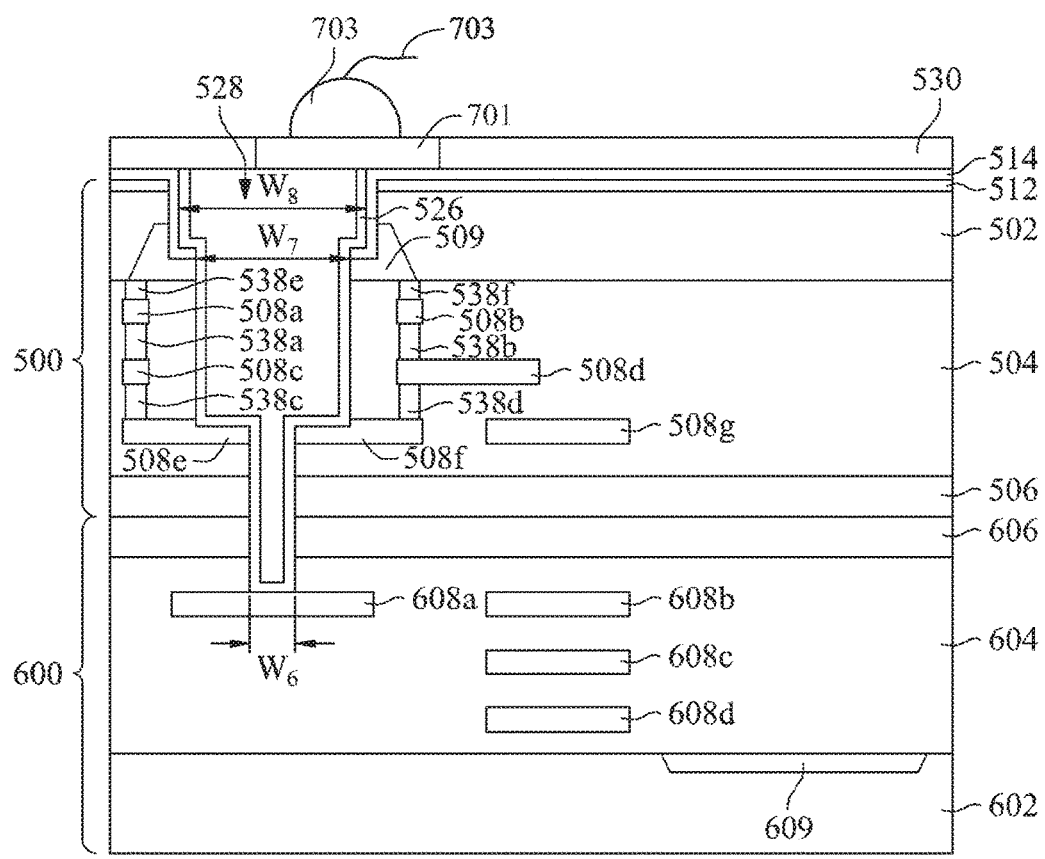

In some embodiments, further process steps may be performed on stacked workpieces illustrated in FIGS. 1D, 2, and 3A-3H. For example, FIG. 3I illustrates further process steps that are performed on stacked workpieces illustrated in FIG. 3H. In some embodiments, a bond pad 701 is formed in the dielectric capping layer 530 and contacts the conductive plug 528. The bond pad 701 may be formed of a conductive material such as aluminum, although other suitable materials, such as copper, tungsten, or the like, may alternatively be utilized. In some embodiment, the dielectric capping layer 530 may be patterned using, for example, a photolithographic masking and etching process to form openings in the dielectric capping layer 530 to expose the conductive plug 528. The material of the bond pad 701 may be deposited to fill the openings using a process such as CVD, PVD, plating, or the like. Once the material of the bond pad 701 has been deposited, any excessive material overfilling the openings may be removed using an etch process, a planarization process (e.g., a CMP process), or the like, such that the topmost surface of the bond pad 701 is substantially coplanar with the topmost surface of the dielectric capping layer 530.

In some embodiments, a connector 703 such as a wire bond is utilized to allow for electrical connection to components and systems external to the stacked workpieces illustrated in FIG. 3I. In an embodiment, an electronic flame off (EFO) wand may be used to raise the temperature of a gold wire within a capillary controlled by a wire clamp (not illustrated). Once the temperature of the gold wire is raised to between about 150° C. and about 250° C., the gold wire is contacted to the bond pad 701 to form the wire bond. Another end of the wire of the wire bond is then contacted and bonded to a bonding pad of an external system to provide electrical connection. One skilled in the art will recognize that connectors such as ball bonds, solder bumps, micro bumps, copper pillars, and the like may also be used to electrically connect the stacked workpieces of FIG. 3I to external devices. Moreover, one skilled in the art will recognize that a plurality of bond pads and corresponding connectors (such as the bond pad 701 and the corresponding connector 703) may be utilized to provide electrical connections to external devices.

The method of forming the bond pad 701 and the connector 703 as described above with reference to FIG. 3I is provided for illustrative purposes only. In other embodiment, formation of bond pads and corresponding connectors may further include, for example, formation of one or more passivation layers, formation of one or more redistribution layers (RDLs), formation of one or more under bump metallurgies (UBMs), or the like over the stacked workpieces of FIG. 3I.

Figure 4:
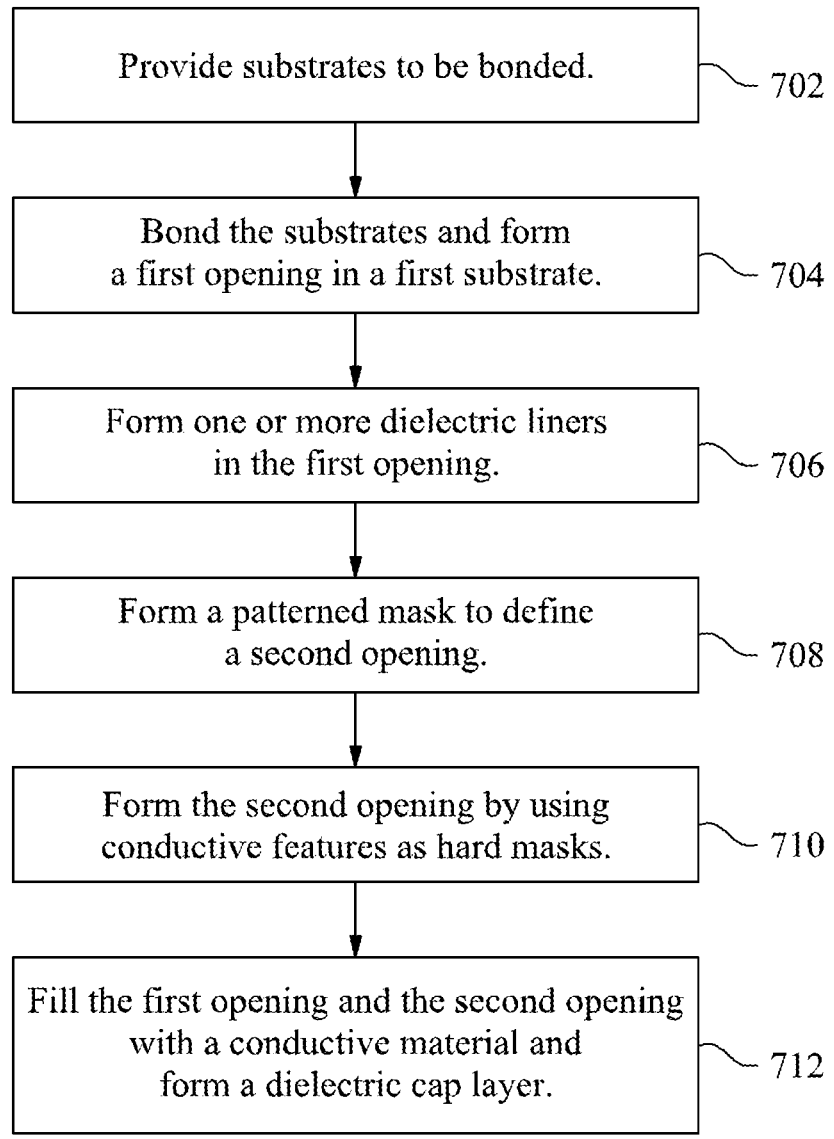
FIG. 4 is a flow diagram illustrating a method of forming an interconnect structure between two bonded workpieces in accordance with some embodiment.

FIG. 4 is a flowchart illustrating a method of forming an interconnect in stacked workpieces in accordance with some embodiments. The method begins in step 702, wherein substrates to be bonded are provided. The workpieces may be processed wafers (such as those illustrated in FIG. 1A), dies, a wafer and a die, or the like.

In step 704, the workpieces are bonded and a first opening is formed in a first substrate of a first workpiece. A patterned mask is formed on the first substrate, the patterned mask defining an opening for a contact plug to be subsequently formed, such as that discussed above with reference to FIG. 1B. Optionally, an ARC layer and/or one or more hard mask layers are formed. Thereafter, a first etch process is performed to etch through the first substrate, such as discussed above with reference to FIG. 1B, thereby forming the first opening.

In step 706, one or more dielectric films are formed within the first opening and along a backside of the first substrate as discussed above with reference to FIG. 1B. A patterned mask, as discussed above with reference to FIG. 1B, is formed to define a second opening to contact select ones of the interconnects formed on the first substrate and/or a second substrate of a second workpiece in step 708. In step 710, another etch process is used to create the second opening while using some of the interconnects formed on the first substrate as hard mask layers, which exposes portions of the interconnects on the first substrate and/or the second substrate, as discussed above with reference to FIG. 1C. The first opening and the second opening are filled with a conductive material in step 712, such as that discussed above with reference to FIG. 1D. A dielectric cap layer may be formed over the conductive material, such as that discussed above with reference to FIG. 1D.

One advantageous feature of the above described method is that the method allows reduction of a conductive plug critical dimension below a dimension achievable, for example, by conventional photolithography methods. Accordingly, by interconnecting bonded workpieces using conductive plugs as described above with respect to FIGS. 1A-3H semiconductor devices with reduced form factors may be formed. In addition, forming a seal ring around the conductive plug as illustrated in FIGS. 3A-3H may provide addition protection to layers surrounding the conductive plug.

According to an embodiment, a semiconductor device comprises a first substrate having a first side and a second side opposite the first side, and first vertically stacked interconnects formed within respective first dielectric layers on the first side of the first substrate. The semiconductor device further comprises a second substrate having a third side and a fourth side opposite the third side, the first side of the first substrate facing the third side of the second substrate, second interconnects formed within respective second dielectric layers on the third side of the second substrate, and a conductive plug extending from the second side of the first substrate to a first conductive feature of the second interconnects, the conductive plug extending through at least two conductive features of the first vertically stacked interconnects.

According to another embodiment, a semiconductor device comprises a first workpiece having a first side and a second side opposite the first side, the first workpiece comprising first dielectric layers formed on the first side, the first dielectric layers having a first interconnect and a second interconnect formed therein, wherein the first interconnect and the second interconnect have an annular ring shape, and a second workpiece bonded to the first workpiece, the second workpiece comprising second dielectric layers formed on a third side of the second workpiece, the second dielectric layers having a third interconnect formed therein, wherein the first side of the first workpiece faces the third side of the second workpiece. The semiconductor device further comprises a conductive plug extending from the second side of the first workpiece to the third interconnect. The conductive plug comprises a first portion extending from the third interconnect to the second interconnect, and a second portion extending from the second interconnect to the first interconnect, wherein a width of the second portion is larger than a width of the first portion.

According to yet another embodiment, a method of forming a semiconductor device, the method comprises providing a first workpiece having a first side and a second side opposite the first side, the first workpiece having first vertically stacked interconnects formed in first dielectric layers on the first side, providing a second workpiece, the second workpiece having a second interconnect formed in second dielectric layers on a third side of the second workpiece, and bonding the first workpiece to the second workpiece such that the first side of the first workpiece faces the third side of the second workpiece. The method further comprises forming an opening on the second side the first workpiece, the opening extending through at least two interconnects of the first vertically stacked interconnects, the opening exposing at least a portion the second interconnect, and filling the opening with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first substrate having a first side and a second side opposite the first side;
   a shallow trench isolation (STI) region in the first substrate;
   first vertically stacked interconnects within respective first dielectric layers on the first side of the first substrate;
   a second substrate having a third side and a fourth side opposite the third side, the first side of the first substrate facing the third side of the second substrate;
   second interconnects within respective second dielectric layers on the third side of the second substrate; and
   a conductive plug extending from the second side of the first substrate to a first conductive feature of the second interconnects, the conductive plug extending through the STI region and at least two conductive features of the first vertically stacked interconnects, wherein a width of the conductive plug narrows as the conductive plug extends from a first side of the STI region to a second side of the STI region, and wherein the second side of the STI region is a closest side of the STI region from the first vertically stacked interconnects.

2. The semiconductor device of claim 1, wherein the first vertically stacked interconnects form a seal ring surrounding the conductive plug.

3. The semiconductor device of claim 2, wherein a portion of the first dielectric layers is interposed between the conductive plug and the seal ring.

4. The semiconductor device of claim 1, wherein the first vertically stacked interconnects comprise conductive lines.

5. The semiconductor device of claim 4, wherein the first vertically stacked interconnects further comprise conductive vias.

6. The semiconductor device of claim 1, wherein the first vertically stacked interconnects have annular shapes.

7. The semiconductor device of claim 1, wherein the conductive plug comprises a first portion extending from the first conductive feature of the second interconnects to the first vertically stacked interconnects, and a second portion extending through the at least two conductive features of the first vertically stacked interconnects, a width of the second portion being larger than a width of the first portion.

8. The semiconductor device of claim 7, wherein the conductive plug further comprises a third portion extending through the first substrate, a width of the third portion being larger than the width of the second portion.

9. A semiconductor device comprising:
   a first workpiece having a first side and a second side opposite the first side, the first workpiece comprising first dielectric layers on the first side, the first dielectric layers having a first interconnect and a second interconnect therein, wherein the first interconnect and the second interconnect have an annular ring shape;
   a second workpiece bonded to the first workpiece, the second workpiece comprising second dielectric layers on a third side of the second workpiece, the second dielectric layers having a third interconnect therein, wherein the first side of the first workpiece faces the third side of the second workpiece; and
   a conductive plug extending from the second side of the first workpiece to the third interconnect, the conductive plug comprising:
   a first portion extending from the third interconnect to the second interconnect;
   a second portion extending from the second interconnect to the first interconnect, wherein a width of the second portion is larger than a width of the first portion; and
   a third portion, the third portion extending through a first substrate of the first workpiece, a width of the third portion being larger than the width of the second portion.

10. The semiconductor device of claim 9, wherein the first interconnect and the second interconnect are part of a seal ring, the seal ring surrounding the second portion of the conductive plug.

11. The semiconductor device of claim 10, wherein a portion of the first dielectric layers interposed between the seal ring and the conductive plug is free from conductive features.

12. The semiconductor device of claim 10, wherein the seal ring is electrically coupled to the conductive plug.

13. The semiconductor device of claim 10, wherein the conductive plug extends through a shallow trench isolation (STI) region in the first workpiece.

14. A semiconductor device comprising:
a first substrate;
one or more first metallization layers on a first side of the first substrate, the one or more first metallization layers comprising a stack of first interconnects;
a first insulating layer on the first side of the first substrate, the one or more first metallization layers being interposed between the first substrate and the first insulating layer;
a second substrate;
one or more second metallization layers on a first side of the second substrate;
a second insulating layer on the first side of the second substrate, the one or more second metallization layers being interposed between the second substrate and the second insulating layer, the second insulating layer contacting the first insulating layer;
a conductive plug extending through the first substrate, the one or more first metallization layers, the first insulating layer and the second insulating layer, and extending into the one or more second metallization layers, the stack of first interconnects surrounding the conductive plug, at least two conductive features of the stack of first interconnects being in direct electrical contact with the conductive plug; and
a shallow trench isolation (STI) region on the first side of the first substrate, the conductive plug extending through the STI region, a width of the conductive plug narrowing as the conductive plug extends from an uppermost surface of the STI region to a bottommost surface of the STI region, the uppermost surface of the STI region being a farthest surface of the STI region from the one or more first metallization layers.

15. The semiconductor device of claim 14, wherein the conductive plug electrically couples the stack of first interconnects and a second interconnect in the one or more second metallization layers.

16. The semiconductor device of claim 14, wherein the stack of first interconnects forms a seal ring.

17. The semiconductor device of claim 16, wherein the seal ring comprises conductive lines.

18. The semiconductor device of claim 17, wherein the seal ring further comprises conductive vias.

19. The semiconductor device of claim 17, wherein the seal ring separates the conductive plug from other conductive features in the one or more first metallization layers.

20. The semiconductor device of claim 9, wherein a sidewall of the conductive plug is in physical contact with the second interconnect, and wherein the sidewall of the conductive plug is separated from the first interconnect by at least a portion of the first dielectric layers.

21. The semiconductor device of claim 9, wherein the conductive plug further comprises a fourth portion extending through the second interconnect, a width of the fourth portion changing as the fourth portion extends through the second interconnect.

* * * * *